United States Patent
Kwan et al.

(10) Patent No.: US 9,829,808 B2
(45) Date of Patent: Nov. 28, 2017

(54) METHOD FOR CONTROLLING A MOTION OF OPTICAL ELEMENTS IN LITHOGRAPHY SYSTEMS

(71) Applicant: Carl Zeiss SMT GmbH, Oberkochen (DE)

(72) Inventors: Yim-Bun Patrick Kwan, Aalen (DE); Dick Antonius Hendrikus Laro, Breda (NL)

(73) Assignee: Carl Zeiss SMT GmbH, Oberkochen (DE)

( * ) Notice: Subject to any disclaimer, the term of this patent is extended or adjusted under 35 U.S.C. 154(b) by 703 days.

(21) Appl. No.: 14/227,816

(22) Filed: Mar. 27, 2014

(65) Prior Publication Data

US 2014/0204354 A1    Jul. 24, 2014

Related U.S. Application Data

(63) Continuation of application No. PCT/EP2011/067532, filed on Oct. 7, 2011.

(51) Int. Cl.
*G03B 27/68* (2006.01)
*G03B 27/54* (2006.01)
*G03F 7/20* (2006.01)

(52) U.S. Cl.
CPC ............ *G03F 7/709* (2013.01); *G03F 7/7085* (2013.01); *G03F 7/70591* (2013.01); *G03F 7/70825* (2013.01); *G03F 7/70833* (2013.01)

(58) Field of Classification Search
CPC .. G03F 7/70591; G03F 7/706; G03F 7/70825; G03F 7/7085; G03F 7/70833;

(Continued)

(56) References Cited

U.S. PATENT DOCUMENTS 4,664,487 A    5/1987   Tam
6,150,750 A   11/2000   Burov et al.

(Continued)

FOREIGN PATENT DOCUMENTS

DE           102 25 266        3/2003
DE     10 2011 075 316 A1     11/2012

(Continued)

OTHER PUBLICATIONS

M.G.E. Schneiders et al., "Benefits of over-actuation in motion systems", Proceedings of the 2004 American Control Conference (ACC 2004), Boston, Jun. 30-Jul. 2, 2004.

(Continued)

Primary Examiner — Christina Riddle
(74) Attorney, Agent, or Firm — Fish & Richardson P.C.

(57) ABSTRACT

A method for controlling a vibrating optical element of a lithographic system the optical element having a predetermined number of degrees of freedom comprises: detecting a number of displacements of the optical element, each displacement corresponding to a degree of freedom, wherein the number of detected displacements is larger than the number of degrees of freedom; for each displacement according to a degree of freedom, generating a sensor signal corresponding to a movement in a degree of freedom; wherein the optical element moves as a function of a rigid body transformation matrix, the optical element movement including a first type of movement and a second type of movement; and modifying the sensor signals as a function of a modified transformation matrix, wherein the modified transformation matrix at least partially reduces at least one eigen mode or resonance of one of the first type of movements or the second type of movements.

23 Claims, 7 Drawing Sheets

(58) Field of Classification Search
CPC .. G03F 7/70883; G03F 7/709; G03F 7/70141; G03F 7/70258; G03F 7/70266
USPC .............. 355/52, 53, 55, 67–71, 72, 75, 77; 359/196.1, 201.2, 198.1, 209.1, 359/212.1–213.1, 223.1; 250/492.1, 250/492.2, 492.22, 492.23
See application file for complete search history.

(56) References Cited

U.S. PATENT DOCUMENTS

| | | |
|---|---|---|
| 6,327,065 B1 | 12/2001 | Danial et al. |
| 6,330,052 B1 | 12/2001 | Yonekawa et al. |
| 6,398,373 B1 | 6/2002 | Guzman et al. |
| 6,842,277 B2 | 1/2005 | Watson |
| 7,110,089 B2 | 9/2006 | Mizuno |
| 7,304,717 B2 | 12/2007 | Hummel et al. |
| 7,486,382 B2 | 2/2009 | Back et al. |
| 7,557,903 B2 | 7/2009 | Schoormans et al. |
| 7,710,542 B2 | 5/2010 | Hummel et al. |
| 7,742,149 B2 | 6/2010 | DeVos et al. |
| 7,782,446 B2 | 8/2010 | Kamidi et al. |
| 7,859,643 B2 | 12/2010 | Asada |
| 7,961,294 B2 | 6/2011 | Hummel et al. |
| 8,625,077 B2 | 1/2014 | Ito |
| 8,786,826 B1 | 7/2014 | Bleidistel et al. |
| 2003/0197914 A1* | 10/2003 | Cox .................... G03F 7/70141 355/53 |
| 2004/0017623 A1 | 1/2004 | Watson |
| 2004/0164253 A1 | 8/2004 | Ito |
| 2004/0263812 A1 | 12/2004 | Hummel et al. |
| 2005/0190462 A1 | 9/2005 | Rau et al. |
| 2005/0243298 A1 | 11/2005 | de Jager et al. |
| 2006/0164619 A1 | 7/2006 | Back et al. |
| 2007/0076310 A1 | 4/2007 | Sakino et al. |
| 2007/0132980 A1 | 6/2007 | Schoormans et al. |
| 2007/0280609 A1 | 12/2007 | Ito |
| 2007/0284502 A1 | 12/2007 | Hsin et al. |
| 2008/0100894 A1 | 5/2008 | Asada |
| 2008/0117397 A1 | 5/2008 | Weber et al. |
| 2008/0174757 A1 | 7/2008 | Hummel et al. |
| 2008/0212054 A1 | 9/2008 | Kamidi et al. |
| 2008/0246936 A1 | 10/2008 | Loopstra et al. |
| 2008/0309911 A1 | 12/2008 | Marie De Vos et al. |
| 2009/0021847 A1* | 1/2009 | Nawata ................ G02B 7/005 359/811 |
| 2009/0040487 A1 | 2/2009 | Hummel et al. |
| 2009/0050776 A1 | 2/2009 | Muehlbeyer et al. |
| 2009/0141258 A1 | 6/2009 | Back et al. |
| 2009/0207393 A1 | 8/2009 | Butler et al. |
| 2009/0237793 A1* | 9/2009 | Koo ..................... G02B 27/646 359/555 |
| 2010/0001168 A1* | 1/2010 | Saiki .................. G03F 7/70775 248/550 |
| 2010/0195085 A1 | 8/2010 | Fuse |
| 2011/0062306 A1 | 3/2011 | Heiland |
| 2011/0164230 A1 | 7/2011 | Ito |
| 2011/0199597 A1 | 8/2011 | Hummel et al. |
| 2011/0235015 A1 | 9/2011 | Dengel et al. |
| 2013/0038848 A1 | 2/2013 | Weber et al. |
| 2014/0204356 A1 | 7/2014 | Bleidistel et al. |
| 2014/0300882 A1 | 10/2014 | Bleidistel et al. |
| 2016/0054661 A1 | 2/2016 | Bleidistel et al. |

FOREIGN PATENT DOCUMENTS

| | | |
|---|---|---|
| EP | 1 385 034 | 1/2004 |
| EP | 1 965 258 B1 | 5/2011 |
| JP | 2000-121814 A | 4/2000 |
| JP | 2004-064076 | 2/2004 |
| JP | 2004-506236 | 2/2004 |
| JP | 2004-281664 | 10/2004 |
| JP | 2005-003736 | 1/2005 |
| JP | 2005-150615 A | 6/2005 |
| JP | 2007-103657 | 4/2007 |
| JP | 2007-165875 A | 6/2007 |
| JP | 2007-528125 | 10/2007 |
| JP | 2008-112756 | 5/2008 |
| JP | 2008-219001 A | 9/2008 |
| JP | 2008-300828 A | 12/2008 |
| JP | 2010-182867 A | 8/2010 |
| JP | 2011-142165 A | 7/2011 |
| JP | 2012-507160 A | 3/2012 |
| WO | WO 02/12948 | 2/2002 |
| WO | WO 2005/081060 | 9/2005 |
| WO | WO 2005/101131 | 10/2005 |
| WO | WO 2012/150215 A1 | 11/2012 |

OTHER PUBLICATIONS

M.G.E. Schneiders et al., "Introduction to an Integrated Design for Motion Systems Using Over-Actuation," Proceedings of the European Control Conference 2003 (ECC2003), Sep. 1-4, 2003, Cambridge, UK, (pp. 6). Stevenage: IEE Event Services.

Dick Antonius Hendrikus Laro, "Mechatronic Design of an Electromagnetically Levitated Linear Positioning System using Novel Multi-DoF Actuators," May 18, 2009.

Korean Office Action and English translation thereof for corresponding Korean Appl. No. 10-2014-7011538, 11 pages, dated Aug. 21, 2015.

International Search Report and Written Opinion for corresponding PCT Appl No. PCT/EP2011/067532, dated Aug. 3, 2012.

* cited by examiner

METHOD FOR CONTROLLING A MOTION OF OPTICAL ELEMENTS IN LITHOGRAPHY SYSTEMS

CROSS-REFERENCE TO RELATED APPLICATIONS

The present application is a continuation of, and claims benefit under 35 USC 120 to, international application PCT/EP2011/067532, filed Oct. 7, 2011. The entire disclosure of international application PCT/EP2011/067532 is incorporated by reference herein.

This disclosure relates to methods and devices for controlling rigid body movements and/or excitations. This disclosure, in particular, addresses methods and systems for controlling vibrating or moving optical elements suitable for micro-lithographic systems. For example, aspherical mirrors in EUVL-systems can be mechanically controlled.

For fabricating semiconductor devices having structures less than 45 nm, extreme ultraviolet (EUV) lithography is employed. Because EUV radiation of about 13.5 nm is absorbed by refractive materials microlithography systems for extreme ultra-violet radiation employ reflective mirrors. Such EUV mirrors include usually a substrate and a reflective coating. The substrate with the coating is regarded a rigid body.

Usually, mirrors in EUV exposure tools do not have a regular shape and deviate from exact schematic circular forms. The footprint of the optically used area on such a mirror is sometimes kidney-shaped. The optical EUV system is then employed in a wafer stepper or a wafer scanner which are the most common manufacturing machines in chip fabrication. The optical lithography system projects the mask or reticle structures onto a coated semiconductor wafer for de-magnifying the structure of the retile onto the wafer. The exposure process is carried out step by step. This means the wafer is moved under the optical system by the size of the image field covered by the optics. At the same time, the reticle or mask in the object plane is moved, for example in a step-wise fashion. This exposure process is continued until the entire wafer has been exposed. Eventually, the wafer is chemically and physically processed in order to develop the actual fine micro or nanostructures in the semiconductor.

At least because in such steppers or scanners moving objects like the mask station and the reticle are employed it is desirable to decouple the optical elements, i.e. lithography mirrors, mechanically as much as possible. However, due to the material properties of the mirrors and mountings, which have a limited Young's modulus, vibrations or tiny displacements of the mirrors cannot be completely avoided. Therefore, active control systems are employed in order to compensate for undesired vibrations or motions of the optical elements, i.e. the mirrors.

Usually, kinematic actuators are coupled to the mirrors for compensating undesired motions. In such control loops the eigen modes of the mirrors or optical elements limit the control bandwidth. The most prominent modes are bending modes and torsional modes which can be close to each other in frequency.

Conventionally, for covering six degrees of freedom of a rigid body mirror are covered by a six-sensor-system. However, eigen frequencies of the respective first bending and torsional modes are about 1700 Hz and 1800 Hz. In order to suppress those undesired resonances or eigen modes, notch filters have been employed in control loops. However, such filters need manual tuning because the frequencies of the eigen modes can vary from mirror to mirror between production batches. This would require extensive gauging or adjustments for each mirror. Another conventional approach includes increasing the mirror thickness for increasing the eigen frequencies. However, in specific constellations, the mirrors are very close to the wafer station, and therefore a thickness cannot be extended.

It is therefore an aspect of this disclosure to provide an improved method for controlling rigid body movements in optical devices, in particular in lithography systems.

Therefore, a method for controlling a motion of an optical element of a lithographic system is disclosed. The optical element has a predetermined number of degrees of freedom. The method comprises:
  detecting a number of displacements of the optical element, wherein the number of detected displacements is larger than the number of degrees of freedom;
  for each displacement according to a degree of freedom, generating a sensor signal corresponding to a movement in a degree of freedom; wherein a motion of the optical element can be represented as a rigid body transformation matrix, the optical element movements including a first type of movement and a second type of movement; and
  modifying the sensor signals as a function of a modified transformation matrix, wherein the modified transformation matrix at least partially reduces at least one eigen mode or resonance of one of the first type of movement or the second type of movement.

Each displacement of the optical element as mentioned above may be regarded as corresponding to a degree of freedom.

The optical element as for example a mirror or a lens can be considered a rigid body with a superposition of internal deformations. A motion of the rigid body, for example, includes rotations or translations. The internal dynamics are characterised eigen modes or resonances. Usually, such eigen modes limits the bandwidth of controlling the motion or movements of the optical element as a rigid body.

A representation of the rigid body movement is a rigid body transformation matrix. Hence, by modifying the sensor signals, an effective modified transformation matrix can be obtained. The modified transformation matrix can be constructed as to reduce the contribution of an eigen mode or resonance. The transformation from rigid body motion of a single point on the body and the detected displacements is unique when the number of detected displacements is equal to the number of unconstrained rigid body motions. By using more sensors than rigid unconstrained rigid body motions the transformation can be modified to reduce the visibility of flexible eigen modes. One can make them unobservable.

Preferably, the method further comprises:
  placing a plurality of sensor elements at the or on the optical element, wherein the number of the sensor elements is larger than the number of degrees of freedom, the sensor elements being adapted to detect a movement of the optical element; and
  for each sensor element, generating a sensor signal corresponding to a movement in a degree of freedom.

Detecting the movements of a rigid body having a predetermined number of degrees of freedom, a number of sensor elements is corresponding to the number of degrees of freedom is generally sufficient. In the proposed method, more sensor elements are employed. One may speak of an over-sensing approach. Over-sensing allows for a modification of the sensor signals thereby limiting the influence of certain eigen modes of the rigid body or mirror.

Sensor elements can be implanted as one-dimensional translational sensors. However, embodiments may also include sensor device that are capable of detecting displacement in 2 or 3 degrees of freedom. According to embodiments of the proposed method, the degrees of freedom of displacement measurements is larger than the degrees of freedom of actuation. In embodiments the number of actuators acting each in a predetermined direction is less than the number of movements or displacements measured in predetermined degrees of freedom. However, preferably the number of actuators acting each in a predetermined direction is equal to the number of movements or displacements measured in predetermined degrees of freedom.

In embodiments of the method placing a plurality of sensor elements comprises: placing at least one sensor element at a position close to a nodal line of an eigen mode of the first type of movements or the second type of movements.

For example, if sensors are arranged on a nodal line, certain resonances can be suppressed in the respective sensor signals. For example, a nodal line can be the symmetry axis if there is an eigen mode for a rotation about the symmetry axis of the mirror.

In further embodiments of the method placing a plurality of sensor elements comprises: placing at least two sensor elements symmetrically with respect to a symmetry axis of the optical element.

Both placing sensor elements at positions close to a nodal line and placing sensor elements symmetrically with respect to a symmetry axis of the optical element leads to particular forms of the transformation matrix and allows for advantageous modifications in the transformation matrix. This is due to the over sensing and the structure of the resulting transformation matrixes.

In embodiments of the method modifying the transformation matrix as a function of a pseudo inverse of the transformation matrix is executed for obtaining the modified transformation matrix. Since more sensors or sensor elements and thereby sensor signals are available than necessary for reconstructing the rigid body movements, no unique inverse but a pseudo inverse of the transformation matrix exists. E.g. the Moore-Penrose pseudo inverse pinv( ) of a matrix A obeys the relations: x=pinv(A), then A x A=A, x A x=A.

In some embodiments of the method for controlling a rigid body or optical element, modifying the sensor signals can comprise: adding a null space contribution to the sensor signals, wherein a null space contribution includes the kernel of a pseudo inverse of the transformation matrix. The kernel ker( ) is sometimes also called the null space of a matrix or transformation. The kernel of a matrix A can be defined as $ker(A)=\{x|Ax=0\}$.

In other embodiments of the method, for controlling a rigid body or an optical element, multiplying sensor signals $(S_{Z1}, S_{Z2}, S_{Z3}, S_{Z4})$ with a transposed null space vector; and adding the modified sensor signals to global coordinates (CG) stemming from the transformation matrix.

The method may also comprise: adding a gain to the null space contribution or null space vector such that at least one eigen mode of one of the first type of movements or the second type of movements is suppressed. Adjusting the amplitude of the null space contribution or vector may lead to sensor signals or sensor data that do not contain an undesired resonance or has a much suppressed contribution of such a resonance.

Preferably, the null space contribution or the null space vector does not contain any rigid body information.

Embodiments of the method additionally comprise: generating control signals for actuator devices adapted to compensate predetermined movements of the optical element.

The actor devices are implemented to be controlled, for example, by a control device and may generate an entire movement of the rigid body or optical element to compensate for undesired vibrations.

The optical element is preferably a mirror and more preferably an aspherical mirror of a microlithography projection system. The microlithography projection system is preferably suitable for EUV projections.

In embodiments of the method the first type of movements are translational movements and the second type of movements are rotational movements. Sensor elements can be adapted to detect a linear and/or a rotational movement.

In embodiments of the method the first type of movement is a bending mode and the second type of movement is a torsional mode. Through the method, a contribution of the bending mode in a control path is reduced. Hence, by reducing contributions of the bending mode at eigen modes or resonances, a control bandwidth in a control path can be increased.

According to other embodiments of the method the first type of movement is a torsional mode and the second type of movement is a bending mode, wherein a contribution of the torsional mode in a control path is reduced. E.g. sensor elements are placed at nodal lines of the bending mode, and the torsional mode is suppressed by over-sending.

This disclosure further comprises a mirror system comprising at least one mirror as an optical element, a plurality of sensor elements coupled to the mirror, a plurality of actor elements coupled to the mirror, and a control device that is adapted to execute a method for controlling a vibrating optical element i.e. the at least one mirror.

Additionally, a microlithography projection system for wavelengths less than 193 nm and more preferably less than 20 nm comprises a plurality of mirror systems as mentioned above for imaging an object field in an object plane to an image field in an image plane. The bending modes of the mirrors are made unobservable in the control loops.

For example, the micro-lithography system can be embodied in terms of stepper or EUV tool.

Certain embodiments of the presented method and the system may comprise individual or combined features, method steps or aspects as mentioned above or below with respect to exemplary embodiments.

In the following, embodiments of methods and devices relating to the control of rigid body movements are described with reference to the enclosed drawings.

Like or functionally like elements have been assigned the same reference number if not otherwise indicated.

Figure 1:
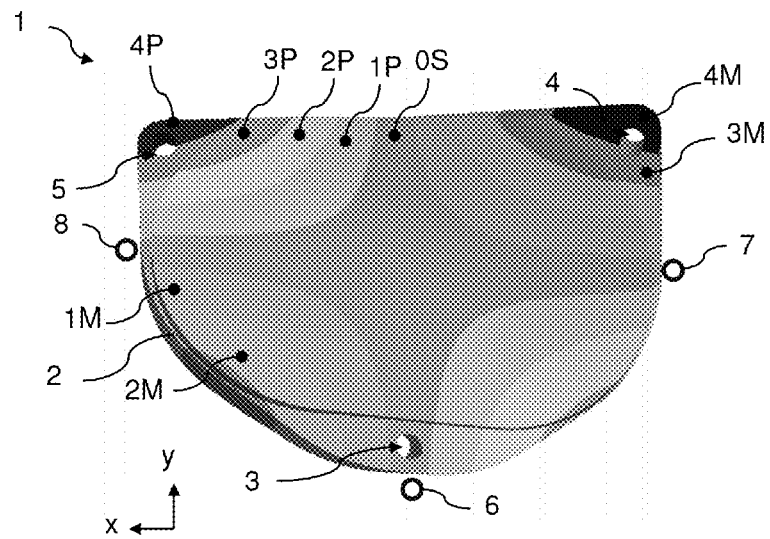
FIGS. 1 and 2 illustrate a first embodiment of a mirror arrangement including sensor positions and bending and torsion modes.
Figure 2:
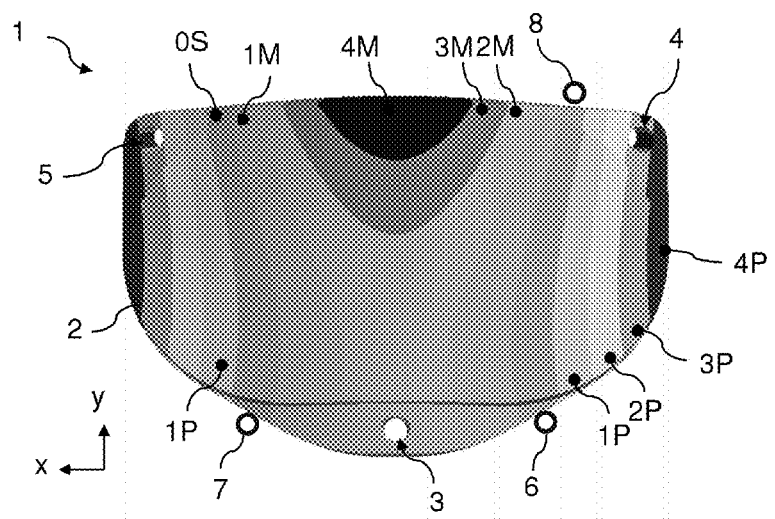

FIGS. 1 and 2 illustrate a first embodiment of a mirror arrangement including sensor positions and modes of the mirror. FIGS. 1 and 2 both show a mirror arrangement 1 with a kidney-shaped mirror 2. The mirror 2 is, for example, suitable for reflecting extreme ultra-violet light (EUV). There are three mounting points 3, 4, 5 where the mirror 2 is, for example, mounted to actuators that allow for a positioning of the mirror 2. Since the mirror 2 is essentially made of a solid material, the mirror corresponds to a rigid body. The grey shades in FIGS. 1 and 2 correspond to amplitudes of the modes.

FIG. 1 shows a torsional mode at for example 1761 Hz. Such a torsional mode may influence the control for a rotation about the Y-axis. The magnitudes of the body movements are indicated by the grey scale. OS refers to basically no movement. 1P, 2P, 3P and 4P indicate an increasing amplitude upwards i.e. out of the paper plane. 1M, 2M, 3M and 4M correspond to increasing negative amplitudes. I.e. mounting point 5 has the highest positive amplitude out of the paper plane. The corner in vicinity of the mounting point 4 has the highest negative amplitude, i.e. into the paper plane. Mounting point 3 in the rotational or torsional mode depicted in FIG. 1 shows basically no movement. There are also sensors 6, 7, 8 indicated in FIG. 1 that detect a motion in the Z-direction. In the figures the direction extends out of the paper plane.

Similarly, FIG. 2 shows the amplitudes of a bending mode at about 1832 Hz. The grey scale indicates the magnitude of the amplitude, i.e., again, 4P is the highest positive amplitude and 2M a lower negative amplitude. In this case, sensors 6, 7, 8 are arranged such that two sensors 6 and 8 are placed in the vicinity of a nodal line of this mode. In typical applications, the torsion and the bending modes are visible in a control loop in Z, Rx and Ry. Conventionally, three sensors as indicated in FIGS. 1 and 2 will be used for reconstructing these three degrees of freedom.

Figure 3:
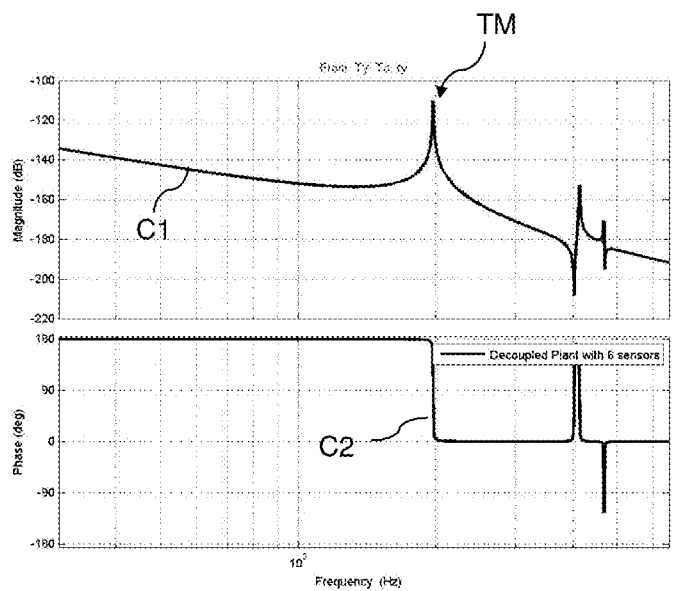
FIG. 3 is a Bode diagram for the mirror arrangement of the first embodiment of FIGS. 1 and 2 in a decoupled configuration.

The flexible mode as shown in FIG. 2 can be reduced by placing sensor elements 6, 7, 8 close to nodal lines of the mode. However, when using three sensors one of the modes remains always visible in a control path. FIG. 3 is a Bode diagram for the mirror arrangement 1 shown in FIGS. 1 and 2 in a decoupled configuration. The Bode diagram or plot shows the system's frequency response. The upper part of the Bode diagram is the magnitude of the frequency response gain, and the lower part of the diagram is the frequency response phase shift.

Curve C1 corresponds to a magnitude response. C2 is the phase shift. Although, not shown in FIGS. 1 and 2, translational in-plane sensors are usually employed such that a total of six sensors for six degrees of freedom are assumed. In the magnitude plot C1 the torsional mode TM is prominent at about 1800 Hertz. "plant" refers to the physical system which consists of the mirror 2, sensors 6, 7, 8 and potentially actor devices.

Figure 4:
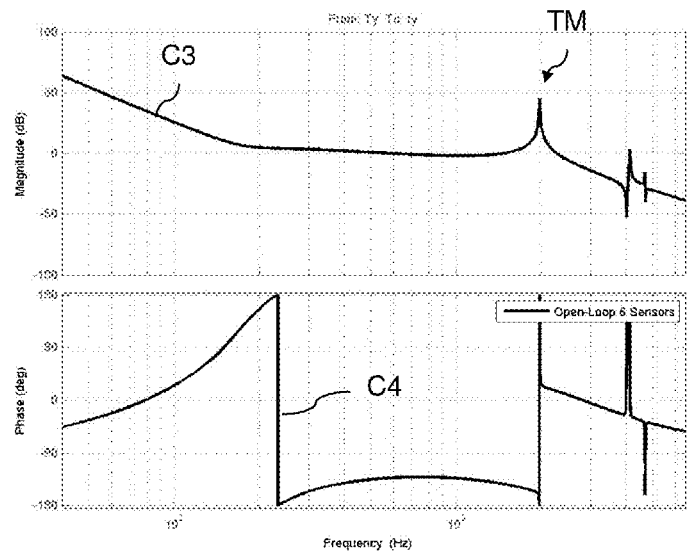
FIG. 4 is a Bode diagram for the mirror arrangement of the first embodiment in a decoupled configuration with an active controller.

When a controller device is activated, the control bandwidth for compensating a movement or controlling the movement of the mirror 2 is limited in particular by the torsional mode TM. This is shown in FIG. 4 illustrating a Bode diagram for the mirror arrangement of FIGS. 1 and 2. Curve C3 corresponds to the magnitude of the frequency response gain and curve C4 the frequency response phase shift. In curve C3 the torsional mode TM has a positive gain of about 40 dB. This means that the torsional mode TM may result in an instability when the controller is activated.

In order to compensate for the torsional mode TM the symmetry of the mirror is exploited in addition to an over-sensing strategy. One can render one mode unobservable by placing sensors in the nodal lines for that mode. This holds, for example for the bending mode illustrated in FIG. 2. The other mode, the torsional mode, can be made unobservable by employing its symmetrical nature and the over-sensing.

Figure 5:
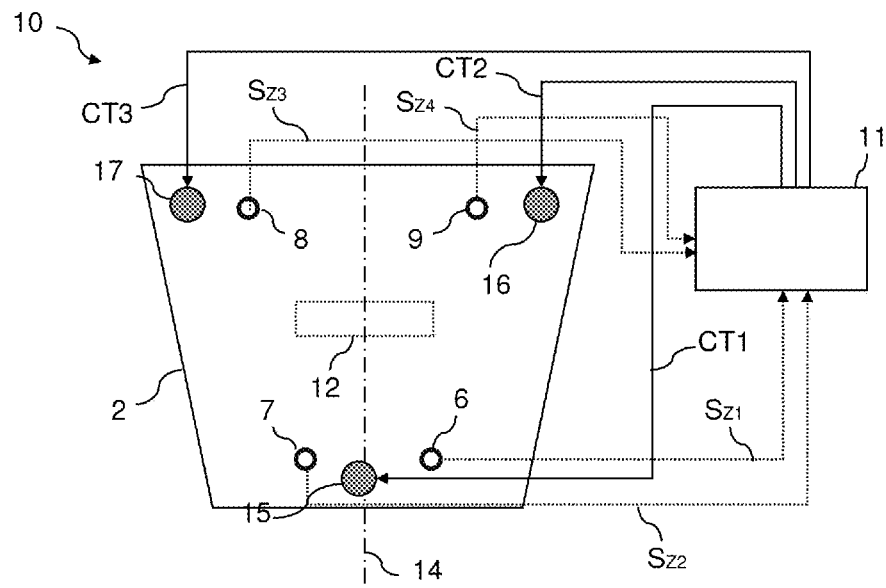
FIG. 5 is a schematic representation of a second embodiment for a system and method for controlling rigid body movements in a mirror arrangement.

FIG. 5 is a schematic representation of a second embodiment for a system and method for controlling rigid body movements in the mirror arrangement. The mirror arrangement 10 comprises a mirror 2, which has a symmetry axis 14. The mirror 4 is mounted or coupled with actuator devices 15, 16, 17 and can be positioned. Basically in the center of the mirror surface 12, the optical footprint or used mirror surface is arranged. FIG. 5 shows four sensor elements 6, 7, 8, 9 of a total of seven sensor elements. The sensor elements 6, 7, 8, 9 may detect a movement in Z-direction. Each sensor element 6, 7, 8, 9 provides for sensor data or sensor signals as Z1-Z4. The sensor data or sensor signals are fed to the control device 11 that processes the sensor data and generates control signals CT1, CT2, CT3 for the actuators. The control device 11 is communicatively coupled to the sensors 6, 7, 8, 9 and the actuators 15, 16, 17. There can be provided more than seven sensors and more than 3 actuator devices.

Conventionally, only 6 sensors are utilized, as for example indicated in FIGS. 1 and 2. Introducing additional sensors for "over sensing" allows for a compensation or correction of undesired eigen modes that might deteriorate the control bandwidth in the system. Although the following examples refer to seven sensors (four vertical and three horizontal sensors) one may contemplate of adding even more sensors.

Figure 6:
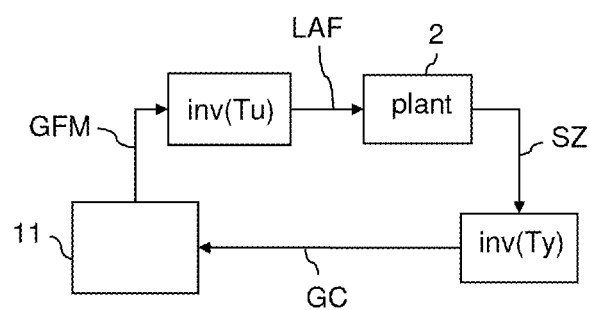
FIG. 6 shows a schematic diagram of a control loop for controlling rigid body movements in a mirror arrangement.

The control loop can be depicted schematically as for example given in FIG. 5 or 6. The method for controlling the vibrating or moving optical element i.e. the mirror 2 is executed and controlled by the control device 11. The physical system is depicted as "plant" 2 carrying seven sensors instead of conventionally six sensors.

Using the sensor signals and assuming rigid body behaviour of the mirror, the motion of a point of the mirror can be reconstructed. To do this the sensors at the plant 2 can be parameterized by the transformation matrix Ty, which relates the global coordinates of the point under consideration to local sensor measurements. The inverse of Ty enables the reconstruction of this point. With reference to the actuators a relation between local forces and global forces and moments acting on a specific point are parameterized by Tu. The inverse of Tu can be used to compute local actuator forces required for generating the global forces and moments. This is illustrated in FIG. 6. The sensor signals SZ are trans-formed to the global coordinates GC, and the control device 11 creates global forces and moments GFM to be employed on the respective point. Through the actuator decoupling matrix inv(Tu) local actuator forces LAF are computed. Ty and Tu are based on the assumption that the mirror acts as a rigid body.

Figure 7:
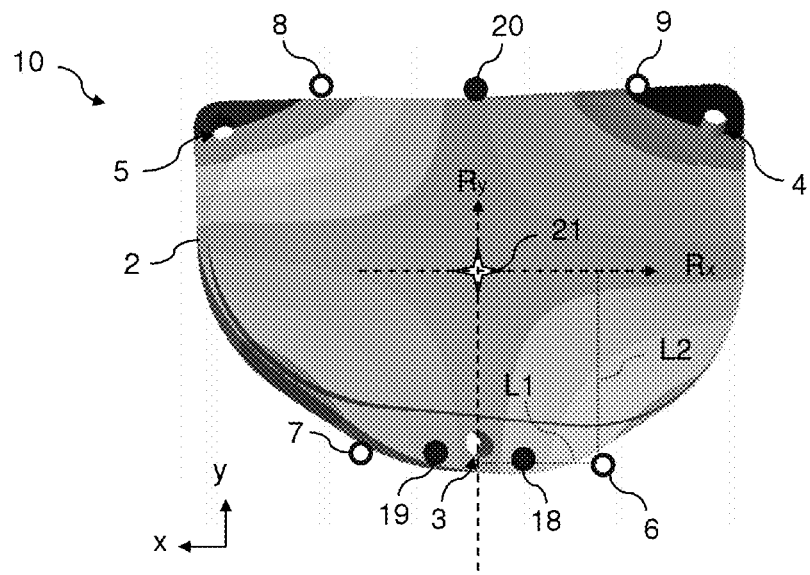
FIGS. 7 and 8 illustrate the mirror arrangement including sensor positions and flexible modes according to the second embodiment.
Figure 8:
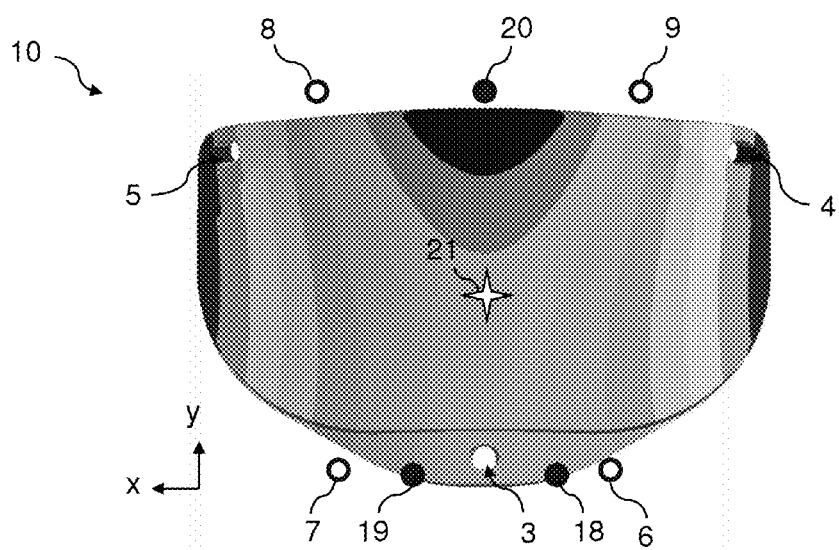

FIGS. 7 and 8 show a detail of the mirror arrangement 10 of FIG. 5. There are four sensors 6, 7, 8, 9 measuring in a vertical direction, which corresponds to the z-direction in the orientation of the figures. The vertical direction extends perpendicularly out of the paper plane. Further, three sensors 18, 19, 20 are shown that measure movements in a horizontal direction, i.e. in the illustration of FIGS. 7 and 8 in-plane.

Figure 9:
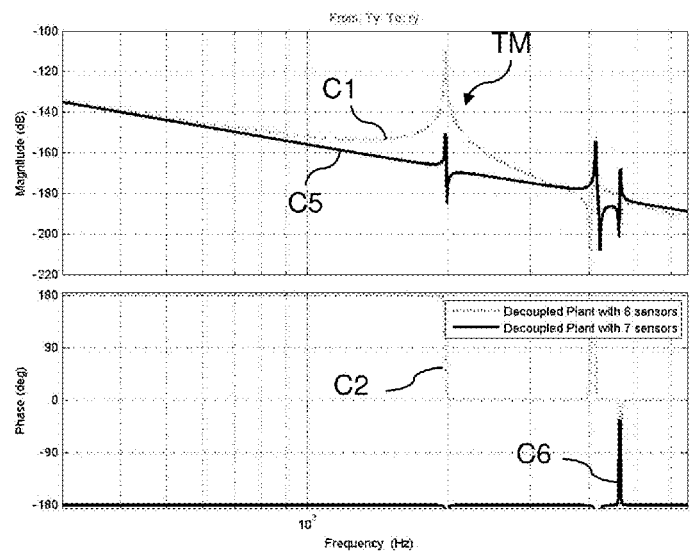
FIG. 9 is a Bode diagram for the mirror arrangement of the second embodiment in comparison with the first embodiment in a decoupled configuration.

FIG. 9 is a Bode diagram for the mirror arrangement shown in FIGS. 5, 7, and 8. However, a method of over-sensing is employed. The upper curve C5 is the magnitude of the frequency response gain and the rotation about the Y-axis using four sensors as shown in FIGS. 7 and 8. In comparison also curve C1 is shown as illustrated in FIG. 3. By using four sensors the frequency response is altered: the torsional mode contribution where using four sensors is less than using three sensors (curve C1). The lower part of FIG. 9 shows the phase shift for decouple plan with six sensors (curve C2) and seven sensors (curve C6). The contributions in the diagram to the right of the torsional mode TM are bending modes which are not considered here, and have only high-frequency contributions. For reducing the contribution of the torsional mode TM, the transformation matrix is manipulated or the sensor data is manipulated in the control device 11. For example, the control device may include a microprocessor or other data processing capable devices. Generally, the transformation matrix can be implemented in terms of data, programmes, signals or the like in the control device 11. However, one may also contemplate of manipulating the sensor signals in an analogue fashion using analogue electronic devices. Next, details of the method for controlling the movement of the mirror 2 are explained.

Referring again to FIGS. 7 and 8 the manipulation of sensor signals is explained. By use of the respective sensor signals one can reconstruct the movement of any point at an arbitrary position on the rigid body, or mirror 2, respectively. For illustrative reasons, the center of gravity 21 is chosen as a representative point. In this context, the measurements of the sensors 6, 7, 8, 9, 18, 19, 20 are referred to as local displacements, and the movement of the center of gravity 21 is referred to as global displacement. For simplicity, the sensor signals are considered as being representative for the actual displacement of the respective sensor. For example, the sensor signal $S_{z1}$ generated by sensor 6 corresponds to a displacement of the mirror 2 at the position of the sensor 6 in the z-direction. Hence, the sensor 6 measures in the z-direction.

Hence, the following vector stands for the local degrees of freedom as detected by the seven sensors 6-9, 18-20:

$$\begin{bmatrix} s_{z1} \\ s_{z2} \\ s_{z3} \\ s_{z4} \\ s_{h1} \\ s_{h2} \\ s_{h3} \end{bmatrix}_{[7\times 1]} \quad \text{(Eq. 1)}$$

where $S_{zi}$ are vertical displacements in z-direction, and $S_{hj}$ are in-plane displacements (i=1, 2, 3, 4 and j=1, 2, 3).

With respect to the center of gravity, displacements (x, y, z) and rotations ($R_x$, $R_y$, $R_z$) are represented as:

$$\begin{bmatrix} x \\ y \\ z \\ R_x \\ R_y \\ R_z \end{bmatrix}_{[6\times 1]} 14. \quad \text{(Eq. 2)}$$

Figure 10A:
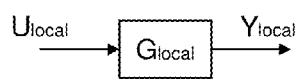
FIGS. 10A-10C shows schematic diagrams of a modified control loop for controlling rigid body movements in a mirror arrangement.

Generally, the response of a system, such as a mirror arrangement, can be depicted diagrammatically as illustrated in FIG. 10A. The mechanical system $G_{local}$ determines the output $Y_{local}$ as a function of the input $U_{local}$ which is expressed as $$Y_{local} = G_{local} \cdot U_{local} \quad \text{(Eq. 3)}$$

Alternatively, in the center of gravity representation the system response reads $$Y_{global} = \text{pinv}(T_y) \cdot Y_{local} \quad \text{(Eq. 4)}$$

The transformation between the representations according to eqs. 1 and 2, or 3 and 4, respectively, is obtained by use of the pseudo inverse of $T_y$.

$$Y_{global} = \text{pinv}(T_y) \cdot G_{local} \cdot U_{local} \quad \text{(Eq. 5)}$$

In, principle, there are infinitely many ways to reconstruct global displacements from local measurements. A starting point for this inverse the pseudo-inverse is taken. FIG. 10B is a diagrammatical illustration of eq. 5. The pseudo inverse pinv( ) is the Moore-Penrose pseudo inverse and fulfils $$\text{pinv}(T_y) \cdot T_y = I_{[6\times 6]} \quad \text{(Eq. 6)}$$

For convenience, one may chose one unique pseudo-inverse. As a result one obtains the relation between the local and global representations $$\begin{bmatrix} s_{z1} \\ \vdots \\ s_{z4} \\ s_{h1} \\ \vdots \\ s_{h3} \end{bmatrix}_{[7\times 1]} = \quad \text{(Eq. 7)}$$

$$T_{y[7\times 6]} \cdot \begin{bmatrix} x \\ \vdots \\ R_z \end{bmatrix}_{[6\times 1]} \Rightarrow \begin{bmatrix} x \\ \vdots \\ R_z \end{bmatrix}_{[6\times 1]} = \text{pinv}(T_y)_{[6\times 7]} \cdot \begin{bmatrix} s_{z1} \\ \vdots \\ s_{z4} \\ s_{h1} \\ \vdots \\ s_{h3} \end{bmatrix}_{[7\times 1]}$$

The matrix $T_y$ in equations 4 and 7 is extracted from the rigid body movements and geometrical considerations. Turning again to FIG. 7 and considering the position of sensor 6 providing a sensor signal $S_{z1}$ relating to a (local) displacement along the z-axis one can calculate the coordinate transformation. Assuming a small rotation angle $\Phi_{Rx}$ about the global x-axis Rx and a small rotation angle $\Phi_{Ry}$ about the global y-axis—sensor 6 is invariant with respect to movements in z-direction—the transformation from the local coordinate to the center of gravity (global) coordinate reads:

$$S_{z_1} = Z \cdot \Phi_{R_x} \cdot L_1 + \Phi_{R_y} \cdot L_2 \quad \text{(Eq. 8)}$$

where sin $\Phi \approx \Phi$. Doing similar calculations for the remaining sensor signals, the transformation matrix $T_y$ has the following entries in arbitrary (length) units:

TABLE 1

|  | Ux | Uy | Uz | Rx | Ry | Rz |
|---|---|---|---|---|---|---|
| $S_{z1}$ | 0 | 0 | 1 | −0.82 | −0.54 | 0 |
| $S_{z2}$ | 0 | 0 | 1 | −0.82 | 0.54 | 0 |
| $S_{z3}$ | 0 | 0 | 1 | 0.27 | 0.55 | 0 |
| $S_{z4}$ | 0 | 0 | 1 | 0.27 | −0.55 | 0 |
| $S_{h1}$ | 0.83 | 0.55 | 0 | −1.97 | 2.96 | 0.99 |
| $S_{h2}$ | 0.83 | −0.55 | 0 | 1.97 | 2.96 | 0.99 |
| $S_{h3}$ | −1 | 0 | 0 | 0 | −3.91 | 0.27 |

Due to the symmetric positions of the sensors with respect to the symmetry axis 14 and a rotation about the axis 14 corresponding to the y axis (column ry) leads to $S_{Z1} = -S_{Z2}$ and $S_{Z3} = -S_{Z4}$. Similarly a rotation about the x axis (column rx) results in $S_{Z1} = S_{Z2}$ and $S_{Z3} = S_{Z4}$.

The entries for a respective pseudo inverse of $T_y$, pinv ($T_y$) can be determined and reads

TABLE 2

|  | $S_{z1}$ | $S_{z2}$ | $S_{z3}$ | $S_{z4}$ | $S_{h1}$ | $S_{h2}$ | $S_{h3}$ |
|---|---|---|---|---|---|---|---|
| Ux | 1.76 | −1.76 | −1.77 | 1.77 | 0.11 | 0.11 | −0.81 |
| Uy | −1.62 | −1.62 | 1.62 | 1.62 | 0.90 | −0.90 | 0 |
| Uz | 0.12 | 0.12 | 0.38 | 0.38 | 0 | 0 | 0 |
| Rx | −0.46 | −0.46 | 0.46 | 0.46 | 0 | 0 | 0 |
| Ry | −0.46 | 0.46 | 0.46 | −0.46 | 0 | 0 | 0 |
| Rz | −0.11 | 0.11 | 0.11 | −0.11 | 0.41 | 0.41 | 0.68 |

The null space or kernel of the pseudo inverse according to $$[0]_{[6 \times 1] = pinv(T_y) \cdot \text{Null}(pinv(T_y))} \quad \text{(Eq. 9)}$$

does not contain rigid body information but refers to flexible modes of the rigid body/mirror. The null space dynamics fulfills:

$$P_{nullspace} = [\text{Null}(pinv(T_y))]^T \cdot \text{Plant} \cdot inv(T_u) \quad \text{(Eq. 10)}$$

The symbol · stands for a matrix multiplication, and equation 10 describes the null space dynamics. The number of null space vectors available corresponds to the number of sensors in addition to the required number of sensors for reconstructing the motion of a point on or at the rigid body. In the present example seven instead of six sensors which are required are used, i.e. an over sensing of one sensor is employed. As a result one null space vector can be determined. The entries of the null space vector Null (pinv (Ty))=ns can be written as:

TABLE 3

| $S_{z1}$ | 0.5011 |
|---|---|
| $S_{z2}$ | −0.5011 |
| $S_{z3}$ | 0.4989 |
| $S_{z4}$ | −0.4989 |
| $S_{h1}$ | 0 |
| $S_{h2}$ | 0 |
| $S_{h3}$ | 0 |

The null space does not comprise rigid body dynamics. Thus, a manipulation of the sensor signals by use of null space contributions does not alter the rigid body control. However, in the control loop undesired torsional contributions can be reduced or compensated for. When the controlled system, i.e. the mirror system is combined with the null space, no additional (translational) rigid body modes are introduced. Rather, flexible modes are removed from the control loop. Adding null space dynamics and implementing a respective transformation in the control device 11 does not affect the actual sensing and controlling.

Figure 10C:
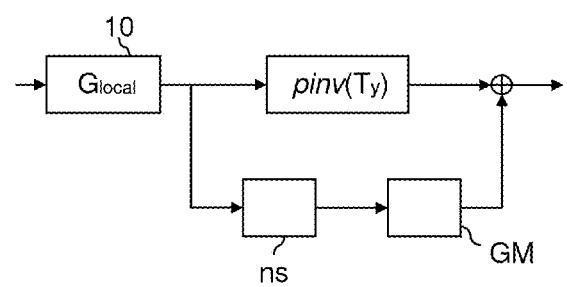
Figure 10B:
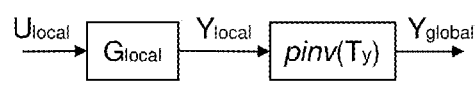

The lower branch of FIG. 10C illustrates an implementation of null space "manipulation" in a control loop. $G_{local}$ and ns, which refers to the transformation $[\text{Null}(pinv(T_Y))]^T$ combine to sensor signals that are loaded with a null space contribution. Additionally, GM standing for a gain matrix, controls the magnitude of the null space contribution governed by ns. GS determines the amount of null space dynamics that is added or substracted to or from the control loop for suppressing a mode that potentially deteriorates the control bandwidth of the system.

Each additional sensor with respect to a basic six-sensor control system allows for the manipulation or reduction of one flexible mode. In the present example, the 1700 Hz flexible mode shall be removed.

The next equation describes the transformation from global forces/moments to local forces. In the actual system, the controller acts in the global coordinate system while the actuators produce local forces. Therefore, Tu is a static transformation which transforms the global controller forces and moments to local actuator forces.

$$\begin{bmatrix} F_x \\ \vdots \\ F_z \\ M_x \\ \vdots \\ M_z \end{bmatrix}_{[6 \times 1]} = \quad \text{(Eq. 11)}$$

$$T_{u[6 \times 6]} \cdot \begin{bmatrix} F_1 \\ \vdots \\ F_6 \end{bmatrix}_{[6 \times 1]} \Rightarrow \begin{bmatrix} F_1 \\ \vdots \\ F_6 \end{bmatrix}_{[6 \times 1]} = inv(T_u)_{[6 \times 6]} \cdot \begin{bmatrix} F_x \\ \vdots \\ F_z \\ M_x \\ \vdots \\ M_z \end{bmatrix}_{[6 \times 1]}$$

$F_i$ refers to the forces exercised by 6 actuators which are controlled by the controller 11, $F_x$, $F_y$, $F_z$ relate to linear forces, and $M_x$, $M_y$, $M_z$ to moments of torque around the x, y, and z axis, respectively. $T_u$ describes the actor system (see FIG. 6).

Instead of adding null space dynamics to the control loop along the lines of FIG. 10C, one can directly transform or adjust the transformation matrix $T_y$ with the null space vector.

As an example, the Ry loop is considered and adjusted by the (transposed) null space vector with a gain factor of 0.0283. Taking the Ry-row of table 2 (−0.46, 0.46, 0.46, −0.46, 0, 0, 0) leads to a $T_y'$ having the entries:

TABLE 4

|    | $S_{z1}$ | $S_{z2}$ | $S_{z3}$ | $S_{z4}$ | $S_{h1}$ | $S_{h2}$ | $S_{h3}$ |
|----|----------|----------|----------|----------|----------|----------|----------|
| Ux | 1.76     | −1.76    | −1.77    | 1.77     | 0.11     | 0.11     | −0.81    |
| Uy | −1.62    | −1.62    | 1.62     | 1.62     | 0.90     | −0.90    | 0        |
| Uz | 0.12     | 0.12     | 0.38     | 0.38     | 0        | 0        | 0        |
| Rx | −0.46    | −0.46    | 0.46     | 0.46     | 0        | 0        | 0        |
| Ry | −0.013   | 0.013    | 0.013    | −0.013   | 0        | 0        | 0        |
| Rz | −0.11    | 0.11     | 0.11     | −0.11    | 0.41     | 0.41     | 0.68     |

Figure 11:
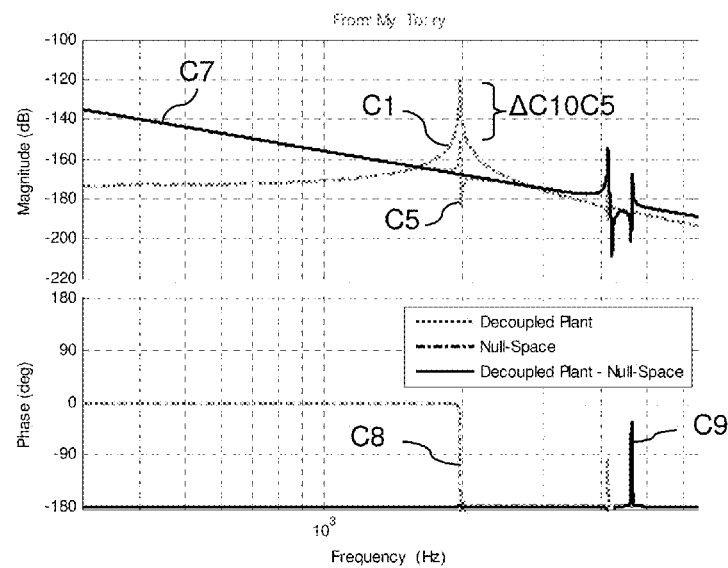
FIG. 11 is a Bode diagram for the mirror arrangement of the second embodiment illustrating a correctional transfer function.

FIG. 11 is a Bode diagram for the mirror arrangement with the correctional transfer functions. Curve C10 in the upper frequency response gain diagram refers to the null space contribution. It is evident from FIG. 11 that the null space does not contain any rigid body information as left from the peak at frequencies lower than about 2000 Hz the null space curve C10 flattens towards about −170 dB. For comparison, curve C5 is reproduced as well. The necessary gain for correctly compensating for the resonance can be determined from the difference in the magnitude of curves C5 and C10 which is indicated as ΔC10C5 in FIG. 11.

As a result of manipulating the translational matrix or adding the null space contribution curve C10 referring to the decoupled plant or physical system 2 one arrives at curve C7. The combined frequency response with the null space contribution is shown in FIG. 11 as curve C7. One can see for example, referring to the phase shift C8 that about the resonance the resultant curve C7 does not show any resonance that would limit the bandwidth of a control loop. Hence, by employing the before-explained method, the positioning and controlling of a mirror in a lithographic system is enhanced.

Figure 12:
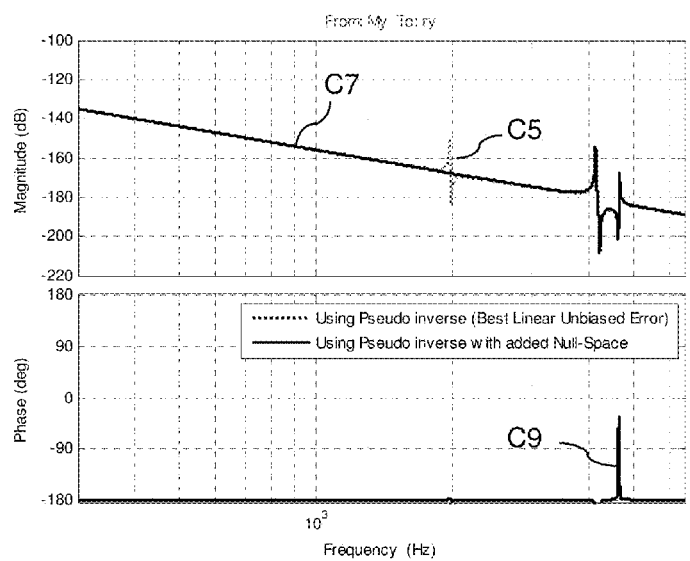
FIG. 12 is a Bode diagram for the mirror arrangement of the second embodiment illustrating a corrected transfer function.

Turning now to FIG. 12, the frequency response in terms of a Bode diagram with manipulated sensor data is shown. FIG. 12 shows curves C5 which is the frequency response function in Ry using four sensors (leading to a total of seven sensors for six degrees of freedom), however, without compensation or adding null space contributions. Curve C7 refers to the compensating to the frequency response where the flexible mode is made unobservable.

Figure 13:
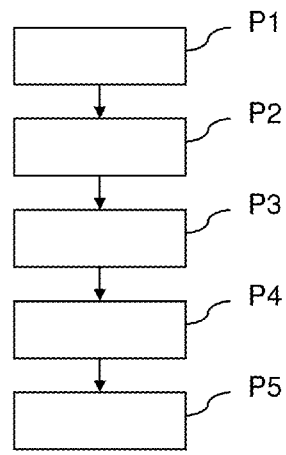
FIG. 13 illustrates an embodiment of a method for controlling a rigid body movement.
Figure 14:
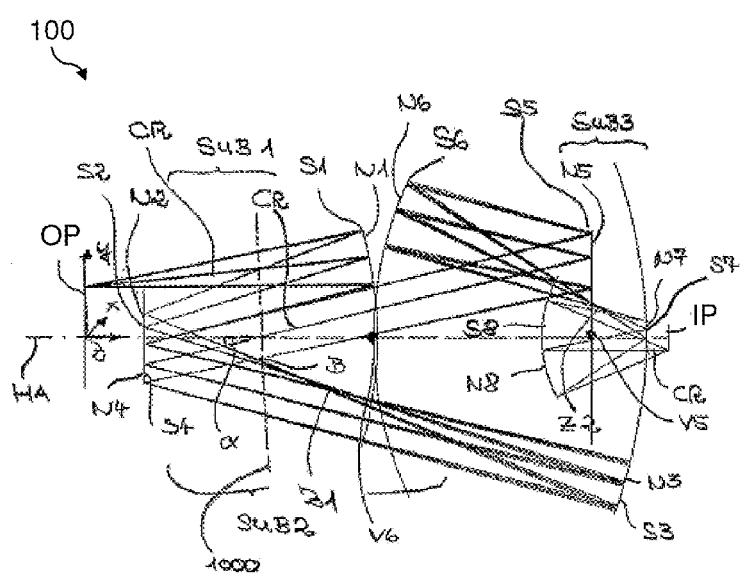
FIG. 14 is a schematic representation of a third embodiment for a system and method for controlling rigid body movements in a mirror arrangement.

Summing up the above explicated method one arrives at method steps as illustrated in FIG. 13. First, a system including a rigid body, such as a mirror arrangement in or of a lithographic system, is provided (P1). For, example a lithographic system according to a third embodiment is depicted in FIG. 14.

Next, sensor elements are placed on or at the mirror to be controlled (P2). Referring to FIG. 14, e.g. mirrors S1 or S2 may be controlled with respect to their movements or vibrations.

The sensor elements produce sensor signals or sensor data as explained above (P3). The number of sensor elements exceeds the number of degrees of freedom in which the mirror is able to move/vibrate. Hence, an over sensing is established.

When analyzing the sensor data the respective transformation matrix $T_y$ is processed as to have a reduced contribution from at least one eigen mode (P4). E.g. without placing sensors in the nodes of a bending mode and processing the transformation matrix with a null space contribution, the torsional mode at 1700 Hz in the above depicted examples would deteriorate the control bandwidth.

Finally, using the modified sensor signals, sensor data, and/or transformation matrix or matrices a frequency response function of the mirror system is obtained which allows for a better control of the mirror body. Thereby, undesired movements of the mirror, i.e. a rigid body can be compensated for. The controller device controls the actuators as a function of the modified sensor signals, sensor data, and/or transformation matrix or matrices (P5).

Turning to FIG. 14 which corresponds to FIG. 3 of WO 2006/094729 A2 a lithographic projection system 100 is shown. A plurality of optical elements S1-S8 is implemented as aspherical mirrors and arranged along the optical axis HA between the object plane OP and the image plane IP. In FIG. 14 the chief ray CR is indicated. For achieving a high quality projection, the mirrors should be controlled and positioned mechanically. In particular mirrors S1 or S2 are provided with a control system depicted above for reducing movements that might alter the imaging quality of the mirror arrangement. Hence, a method for controlling the mirror movements is executed.

Although, the invention is explained with reference to specific examples it can be modified and extended. Although examples shown with one additional sensor element with respect to the minimum number of sensor elements for the considered degrees of freedom, one may also add more sensor elements. The more sensor elements are used and placed in a symmetric fashion with respect to symmetry axes the more flexible modes can be reduced. Although mirrors are used as exemplary rigid bodies, the methods and systems for controlling motions of optical elements can be employed to lenses or other rigid-body like devices as well. There are various methods available for obtaining pseudo inverse matrices. The proposed methods and systems lead to a robust means for controlling optical elements in particularly in lithography systems.

USED REFERENCE SIGNS 1 mirror arrangement
2 mirror
3, 4, 5 mounting point
6, 7, 8, 9 vertical sensor
10 mirror arrangement
11 controller device
12 mirror window
14 axis of symmetry
15, 16, 17 actuator device
18, 19, 20 horizontal sensor
21 center of gravity
100 mirror arrangement
CT1-CT3 control signal
S0 amplitude
SZ1-SZ4 sensor signal
1P-4 amplitude
1M-4M amplitude
LAF local actuator force
SZ sensor signals
GFM global forces and moments
GC global coordinates
GM gain matrix
L1, L2 center of gravity coordinate
pinv pseudo inverse matrix
ns null space contribution
Δ gain

The invention claimed is:

1. A method, comprising:
   detecting a number of displacements of an optical element of a lithographic system, the number of detected displacements being greater than a number of degrees of freedom of the optical element;
   for each displacement according to a degree of freedom, generating a sensor signal corresponding to a movement in a degree of freedom, a motion of the optical element being representable as a rigid body transformation matrix, and the optical element movements comprising first and second types of movement; and modifying the sensor signals in dependence on a modified transformation matrix, the modified transformation matrix at least partially reducing at least one eigen mode or resonance of a movement selected from the group consisting of the first type of movement and the second type of movement, wherein the method further comprises modifying the rigid body transformation matrix in dependence on a pseudo inverse of the rigid body transformation matrix to obtain the modified transformation matrix.

2. The method of claim 1, wherein a number of sensor elements are disposed at the optical element, the number of the sensor elements is greater than the number of degrees of freedom, and the sensor elements are configured to detect at least one displacement of the optical element.

3. The method of claim 2, wherein at least one sensor element is disposed at a position close to a nodal line of an eigen mode of a movement selected from the group consisting of the first type of movement and the second type of movement.

4. The method of claim 2, wherein at least two sensor elements are disposed symmetrically with respect to a symmetry axis of the optical element.

5. The method of claim 2, wherein the sensor elements are configured to detect a linear movement or a rotational movement.

6. The method of claim 1, wherein modifying the sensor signals comprises adding a null space contribution to the sensor signals, the null space contribution including a kernel of a pseudo inverse of the rigid body transformation matrix.

7. The method of claim 6, further comprising adding a gain to the null space contribution to suppress at least one eigen mode of a movement selected from the group consisting of the first type of movement and the second type of movement.

8. The method of claim 6, wherein the null space contribution does not contain rigid body information.

9. The method of claim 1, wherein modifying the sensor signals comprises:
multiplying the sensor signals with a transposed null space vector; and
adding the modified sensor signals to global coordinates stemming from the transformation matrix.

10. The method of claim 9, further comprising adding a gain to the null space contribution to suppress at least one eigen mode of a movement selected from the group consisting of the first type of movement and the second type of movement.

11. The method of claim 9, wherein the null space contribution does not contain rigid body information.

12. The method of claim 1, further comprising generating control signals for actuator devices configured to compensate predetermined movements of the optical element.

13. The method of claim 1, wherein the optical element comprises a mirror of a microlithography projection system.

14. The method of claim 1, wherein the first type of movements are translational movements, and the second type of movements are rotational movements.

15. The method of claim 1, wherein the first type of movement is a bending mode, and the second type of movement is a torsional mode.

16. The method of claim 15, wherein a contribution of the bending mode in a control path is reduced.

17. The method of claim 1, wherein the first type of movement is a torsional mode, and the second type of movement is a bending mode.

18. The method of claim 1, wherein a contribution of the torsional mode in a control path is reduced.

19. A projection system, comprising:
a plurality of mirror systems,
wherein for each mirror system:
the mirror system comprises:
a mirror;
a plurality of sensor elements coupled to the mirror;
a plurality of actuator elements coupled to the mirror; and
a control device; and
the control device is configured so that during use of the mirror system:
a number of displacements of the mirror are detected, the number of detected displacements being greater than a number of degrees of freedom of the mirror;
for each displacement according to a degree of freedom, a sensor signal is generated which corresponds to a movement in a degree of freedom, a motion of the mirror being representable as a rigid body transformation matrix, and the mirror movements comprising first and second types of movement;
the sensor signals are modified in dependence on a modified transformation matrix, the modified transformation matrix at least partially reducing at least one eigen mode or resonance of a movement selected from the group consisting of the first type of movement and the second type of movement; and
the control device is configured so that during use of the mirror system the rigid body transformation matrix is modified in dependence on a pseudo inverse of the rigid body transformation matrix to obtain the modified transformation matrix; and
the projection system is a microlithography projection system configured to operate at a wavelength less than 193 nm.

20. The projection system of claim 19, wherein the projection system is configured so that, during use of the projection system, control loops render unobservable at least one bending mode or torsional mode of the mirrors.

21. The projection system of claim 19, wherein the control device is configured so that during use of the projection system modifying the sensor signals comprises:
multiplying the sensor signals with a transposed null space vector; and
adding the modified sensor signals to global coordinates stemming from the transformation matrix.

22. A method, comprising:
detecting a number of displacements of an optical element of a lithographic system, the number of detected displacements being greater than a number of degrees of freedom of the optical element;
for each displacement according to a degree of freedom, generating a sensor signal corresponding to a movement in a degree of freedom, a motion of the optical element being representable as a rigid body transformation matrix, and the optical element movements comprising first and second types of movement; and
modifying the sensor signals in dependence on a modified transformation matrix, the modified transformation matrix at least partially reducing at least one eigen mode or resonance of a movement selected from the group consisting of the first type of movement and the second type of movement,
wherein the method further comprises modifying the sensor signals comprises adding a null space contribution to the sensor signals, the null space contribution including a kernel of a pseudo inverse of the rigid body transformation matrix.

23. A projection system, comprising:
a plurality of mirror systems,
wherein for each mirror system:
the mirror system comprises:
a mirror;
a plurality of sensor elements coupled to the mirror;
a plurality of actuator elements coupled to the mirror; and
a control device; and
the control device is configured so that during use of the mirror system:
a number of displacements of the mirror are detected, the number of detected displacements being greater than a number of degrees of freedom of the mirror;
for each displacement according to a degree of freedom, a sensor signal is generated which corresponds to a movement in a degree of freedom, a motion of the mirror being representable as a rigid body transformation matrix, and the mirror movements comprising first and second types of movement;
the sensor signals are modified in dependence on a modified transformation matrix, the modified transformation matrix at least partially reducing at least one eigen mode or resonance of a movement selected from the group consisting of the first type of movement and the second type of movement; and
the control device is configured so that during use of the system modifying the sensor signals comprises adding a null space contribution to the sensor signals, the null space contribution including a kernel of a pseudo inverse of the rigid body transformation matrix; and
the projection system is a microlithography projection system configured to operate at a wavelength less than 193 nm.

* * * * *

UNITED STATES PATENT AND TRADEMARK OFFICE
CERTIFICATE OF CORRECTION

PATENT NO. : 9,829,808 B2  
APPLICATION NO. : 14/227816  
DATED : November 28, 2017  
INVENTOR(S) : Yim-Bun Patrick Kwan and Dick Antonius Hendrikus Laro Page 1 of 1

It is certified that error appears in the above-identified patent and that said Letters Patent is hereby corrected as shown below:

On the Title Page

Page 2, Column 2, Line 4, under "OTHER PUBLICATIONS", delete "IEE" and insert -- IEEE --.

In the Specification

Column 7, Line 1, delete "trans-formed" and insert -- transformed --.

Column 8, Line 38, delete "chose" and insert -- choose --.

Column 9, Line 24, after "$S_{Z4}$", insert -- . --.

Column 10, Line 20, delete "substracted" and insert -- subtracted --.

Signed and Sealed this  
Sixth Day of March, 2018

Andrei Iancu  
*Director of the United States Patent and Trademark Office*